United States Patent [19]

Herrmann et al.

[11] Patent Number: 5,017,457

[45] Date of Patent: May 21, 1991

[54] PRESENSITIZED PRINTING PLATE FOR WATERLESS LITHOGRAPHIC PRINTING AND PROCESS FOR PRODUCTION THEREOF

[75] Inventors: Heinz Herrmann, Wiesbaden; Susanne Billino, Ruesselsheim, both of Fed. Rep. of Germany

[73] Assignee: Hoechst Aktiengesellschaft, Frankfurt am Main, Fed. Rep. of Germany

[21] Appl. No.: 239,468

[22] Filed: Sep. 1, 1988

[30] Foreign Application Priority Data

Sep. 9, 1987 [DE] Fed. Rep. of Germany ....... 3730213

[51] Int. Cl.$^5$ .............................................. G03C 1/492
[52] U.S. Cl. ................................... 430/272; 430/156; 430/166; 430/159; 430/303
[58] Field of Search ............... 430/271, 272, 273, 278, 430/935, 156, 166, 159, 303; 101/453

[56] References Cited

U.S. PATENT DOCUMENTS

| Re. 30,670 | 7/1981 | Ezumi et al. | 430/281 |
|---|---|---|---|
| 3,632,375 | 1/1972 | Gipe | 117/34 |
| 3,677,178 | 7/1972 | Gipe | 101/450 |
| 3,728,123 | 4/1973 | Gipe | 96/75 |
| 3,909,265 | 9/1975 | Miyano et al. | 96/33 |
| 4,225,663 | 9/1980 | Ball | 430/303 |
| 4,842,988 | 6/1989 | Herrman et al. | 430/14 |
| 4,842,990 | 6/1989 | Herrmann et al. | 430/212 |

FOREIGN PATENT DOCUMENTS

| 1332326 | 10/1973 | United Kingdom . |
| 1454017 | 10/1976 | United Kingdom . |

OTHER PUBLICATIONS

Chemical Abstract, vol. 93; No. 12, Dec., 1980, Abstract No. 93: 228624n.
Chemical Abstract, vol. 100; No. 20, May, 1984; Abstract No. 165457A.

Primary Examiner—Charles L. Bowers, Jr.
Assistant Examiner—J. Weddington
Attorney, Agent, or Firm—Foley & Lardner

[57] ABSTRACT

A presensitized printing plate for waterless lithographic printing is described which is composed of a substrate, a printing ink-repellent crosslinked silicone elastomer coating situated thereon, an intermediate coating of amorphous silicic acid or of an exposed coating of a photosensitive organic halogen compound and a radiation-sensitive coating. The intermediate coating effects a better adhesion of the photosensitive coating to the silicone coating and, consequently, a better resistance to developer and better print run of the plate.

11 Claims, No Drawings

PRESENSITIZED PRINTING PLATE FOR WATERLESS LITHOGRAPHIC PRINTING AND PROCESS FOR PRODUCTION THEREOF

BACKGROUND OF THE INVENTION

The present invention relates to a presensitized printing plate for waterless lithographic printing, in particular offset printing, and also to a process for the production thereof. The printing plate according to the invention has a substrate, a silicone rubber coating which repels printing ink and an outer, radiation-sensitive coating.

Presensitized printing plates for waterless lithographic printing are known, it being possible for the ink-repellent coating to be situated above or below the photosensitive coating. If the photosensitive coating is disposed as the uppermost coating, the plate has the advantage that it can be developed substantially more easily than in the converse case; it is substantially more difficult to develop a plate with an ink-repellent covering coating, for example of silicone rubber, by removing the areas of the photosensitive coating soluble in the developer and the areas of the silicone coating situated above them. Usually the addition of fairly large quantities of organic solvent to the developer or a developer based on organic solvents and generally mechanical assistance by rubbing, brushing or the like are necessary. The developer is contaminated by the insoluble silicone rubber particles and therefore has to be renewed more frequently.

Despite these known disadvantages, plates with a silicone coating as uppermost coating have hitherto mainly prevailed in practice. This is due, inter alia, to the difficulty of anchoring a photosensitive coating on a cured silicone rubber coating so it adheres firmly. In the prior art, in addition to many printing plates with this coating arrangement, a number of printing plates have also been described for waterless offset printing in which the photosensitive coating is the outer coating.

DE Pat. No.-B-1,571,890 describes a dry lithographic printing plate in which a toner image or a photosensitive coating, which is processed by exposure to light and development to yield the printing ink-receptive image, is applied to a cured silicone elastomer coating. Optionally, a prefabricated metal coating is pressed onto the silicone elastomer coating and then provided with a photosensitive coating. An oleophilic image is produced on the oleophobic silicone coating by exposure to light, development and etching. Without the intermediate coating, only low print runs are obtained, while with the relatively thick copper interlayer, the run is high, but a high resolution, as with the usual offset plates, cannot be obtained.

DE Pat. Nos.-A-2,039,901 and 2,361,815 describe a process for producing a waterless printing offset plate in which a photosensitive coating and an uncured silicone elastomer coating are produced on separate coating bases, then laminated and heated to cure the silicone coating. The process is laborious and requires the use of very narrowly limited materials.

U.S. Pat. No. 3,632,375 describes waterless printing lithographic printing plates which carry an anchoring coating on a silicone rubber coating and a photosensitive coating thereon. The anchoring coating is mostly composed of water-soluble polymers which are optionally crosslinked in addition. The anchoring coatings and the photosensitive coatings are mostly hydrophilic and therefore accept ink badly. The developer resistance of these materials is also low.

U.S. Pat. No. 3,728,123 describes a similar material in which the intermediate coating is itself light-hardenable.

DE Pat. No.-B-2,449,172 describes a presensitized lithographic printing plate for waterless lithographic printing which carries a photo-polymerizable coating on a silicone elastomer coating. A similar material is described in U.S. Pat. No. 4,225,663.

In the known materials for producing waterless printing lithographic printing plates which carry a photosensitive coating on the ink-repellent silicone coating, the adhesion between the coatings is always problematical. If the silicone coating is cured or vulcanized before the application of the photosensitive coating, the wetting of the latter coating becomes difficult and the adhesion is particularly bad. If it is cured after application, there is a risk of such good adhesion of the anchoring of the oleophilic coating parts that the coating parts are not completely removed during development and the silicone coating accepts ink. If an anchoring coating is provided between the two coatings, it is so similar in its nature and composition to the usual constituents, for example, binders, in the photosensitive coating that similar problems arise. In particular, according to the prior art, it is not possible, or only possible in a very laborious manner, to anchor very thin, high-resolution, photosensitive coatings with such good adhesion that highly resolved, well-adhering image stencils, from which high runs can be printed, are obtained by simple development.

German Patent Application P 3,628,719.9 (DE Pat. No.-A-3,628,719 not prepublished) describes a presensitized printing plate for waterless lithographic printing which has a photosensitive coating, an intermediate coating of amorphous silicic acid and a covering coating of silicone rubber on a coating base.

SUMMARY OF THE INVENTION

It is therefore an object of the invention to provide a presensitized printing plate for waterless lithographic printing that can be simply produced by usual processes, that can be developed in essentially aqueous solutions without mechanical assistance and that yields well-differentiated, high-resolution printing stencils with high print run performance.

In accordance with these and other objects of the invention, there is provided a printing plate comprising a substrate, a printing ink-repellent crosslinked silicone elastomer coating situated on the substrate, a single means capable of improving the adhesion of a radiation-sensitive coating to the silicone coating and the ability of the silicone coating to be wetted by the radiation-sensitive coating, the means selected from the group consisting of amorphous silicic acid and an exposed coating of a photosensitive organic halogen compound, and a radiation-sensitive coating overlying the means.

A process is also provided for producing a presensitized printing plate for waterless lithographic printing comprising the steps of applying a silicone elastomer solution to a substrate and drying it, applying to the uncrosslinked silicone elastomer coating an intermediate coating of amorphous silicic acid and a radiation-sensitive coating and crosslinking the silicone elastomer coating to form silicone rubber.

An alternative process comprises the steps of producing a presensitized printing plate for waterless lithographic printing, comprising the steps of applying a silicone elastomer coating to a substrate and drying it, applying an intermediate coating comprising a photosensitive organic halogen compound to the uncrosslinked silicone elastomer coating, exposing the intermediate coating to actinic light without original, applying a radiation-sensitive coating, and crosslinking the silicone elastomer coating to form silicone rubber.

A further alternative process comprises the steps of producing a presensitized printing plate for waterless lithographic printing, comprising the steps of applying a silicone elastomer coating to a substrate and drying it, applying a first intermediate coating of amorphous silicic acid, then applying a second intermediate coating comprising a photosensitive organic halogen compound to the first intermediate coating, exposing the intermediate coatings to actinic light without original, applying a radiation-sensitive coating, and crosslinking the silicone elastomer coating to form silicone rubber.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

According to the invention, a presensitized printing plate for waterless lithographic printing having a substrate, a printing ink repellent crosslinked silicone elastomer coating situated thereon, an intermediate coating and a radiation-sensitive coating is proposed.

The printing plate according to the invention is a printing plate wherein the intermediate coating is composed of amorphous silicic acid or of an exposed coating of a photosensitive organic halogen compound.

According to the invention, a process is proposed for producing a presensitized printing plate for waterless lithographic printing, which comprises applying a silicone elastomer solution to a substrate and drying it, consecutively applying an intermediate coating of amorphous silicic acid and a radiation-sensitive coating to the uncrosslinked silicone elastomer coating and then crosslinking the silicone elastomer coating to form silicone rubber.

Another embodiment of the process according to the invention is a process, wherein a silicone elastomer solution is applied to a substrate and dried, an intermediate coating composed of a photosensitive organic halogen compound is applied to the uncrosslinked silicone elastomer coating, the intermediate coating is exposed to actinic light without original, then a radiation-sensitive coating is applied and thereafter the silicone elastomer coating is crosslinked to form silicone rubber.

The silicone elastomer is crosslinked by thermal vulcanization. This may be carried out to a certain degree after applying the intermediate coating but before applying the radiation-sensitive coating. It is then completed after applying the radiation-sensitive coating. The vulcanization is carried out under conditions under which the temperature-sensitive, radiation-sensitive or photosensitive coatings are not damaged. Good crosslinking is achieved, for example, if the material is heated for a few minutes at 100°–120° C.

The intermediate coatings improve not only the adhesion of the radiation-sensitive coating to the silicone coating, but also the ability of the silicone elastomer coating to be wetted by the radiation-sensitive coating solution.

The silicone elastomer coating is applied from a solution in a nonpolar solvent, for example aliphatic or aromatic hydrocarbons. Basically, any silicone elastomer is suitable which is sufficiently ink-repellent to make printing possible in offset printing without dampening water. In accordance with the definition by Noll in "Chemie und Technologie der Silikone [Chemistry and Technology of the Silicones]", *Verlag Chemie*, 1968, page 332, within the scope of this invention, the term "silicone elastomer" describes a high molecular weight, essentially linear diorganopolysiloxane, whereas the term "silicone rubber" is used for the crosslinked or vulcanized products. A silicone elastomer solution is always applied to the substrate and dried.

Suitable silicone elastomers are cold-curing single-component types and multi-component types which crosslink at low temperature such as are described, for example, in DE-Pat. Nos. A-2,350,211, 2,357,871 and 2,359,102. The single-component silicone elastomers are based on polysiloxanes which contain, for example, terminal acetyl, oxime, alkoxy or amino groups or hydrogen atoms. In other respects, the polysiloxane is composed essentially of a dimethylpolysiloxane chain. The methyl groups may, to a small extent, also be replaced by other alkyl groups, by haloalkyl groups or substituted or unsubstituted aryl groups. The terminal functional groups are readily hydrolyzable and cure on exposure to moisture within a few minutes to hours at room temperature (RTV-1 silicone elastomers).

The multi-component silicone elastomers may be crosslinked by addition or by condensation. The types which can be crosslinked by addition contain, in general, polysiloxanes with alkenyl groups as substituents and those with hydrogen atoms bound to silicon. They are crosslinked in the presence of platinum catalysts at temperatures above 50° C. They have the advantage that they crosslink rapidly at higher temperature, for example around 100 ° C. On the other hand, the processing time (pot life) of these systems may also be relatively short. It is also possible to use mixtures of single-component elastomers and multi-component elastomers, for example two-component silicone elastomers.

The mixtures which can be crosslinked by condensation contain diorganopolysiloxanes with reactive terminal groups, for example OH groups. These are crosslinked with reactive silanes or oligosiloxanes, for example alkoxy- or acetoxysilanes or siloxanes which contain several Si—H groups in the molecule, in the presence of catalysts, such as organic tin compounds, for example, dialkyl tin diacetate. These combinations also react relatively rapidly and therefore have a limited pot life.

With particular advantage, multi-component silicone elastomers which can be crosslinked by condensation are used. In principle all reactive alkoxy- and acetoxysilanes are suitable as crosslinking agents. However, the crosslinking agent affects the adhesion of the photosensitive coating to the silicone elastomer layer with intermediate layer. Preferred crosslinking agents are silanes that carry aminoalkyl or epoxyalkyl groups.

The simultaneous use of several silanes may be beneficial. For example, mixtures of vinyltriacetoxysilane with 3-glycidyloxypropyltrimethoxysilane have proved very successful.

The concentration of the crosslinking agent or the crosslinking agent mixture is usually about 1%–40% of the quantity of polysiloxane, preferably about 2%–20%. The quantity of catalyst is preferably about 2% to 10% by weight, for example about 5%, of the polysiloxane component.

The silicone elastomer coatings may contain reinforcing fillers, such as highly disperse silica. Other finely divided powders composed, for example, of polytetrafluoroethylene or graphite fluoride may also be added. In concentrations at which the adhesiveness is still unreduced, the finely powdered materials facilitate, as a rule, the anchoring of the adhesion and copying layers. Similar effects are also achieved with substances of low surface tension which are soluble in the silicone elastomer solution, for example with polyethylene waxes.

Since the silicone rubber coating does not take part in the development process, its thickness is not critical. For economic reasons, it is only made thick enough to withstand the printing operation well. Thick coatings are also not beneficial if the photosensitive coatings to be applied have low flexibility. As the thickness of the silicone coating increases, the risk of crack formation in the photosensitive coating increases. Usually the coating weight is about 1–100 $g/m^2$, preferably about 3–10 $g/m^2$.

The uncrosslinked, air-dried silicone elastomer coating may be covered with an adhesion-promoting coating in two ways. One way is to coat on a silicic acid sol and subsequently to dry the wet film to form a coating of amorphous silicic acid. Corresponding adhesive coatings have already been provided for anchoring silicone rubber layers on commercial wet offset printing plates in German Patent Application P 3,628,719. Using the second method, adhesive coatings are obtained by applying solutions of photosensitive halogen compounds to the silicone elastomer coating and subsequently exposing the dried coating to actinic light.

To produce the silicic acid adhesive coating, aqueous or aqueous and alcoholic silicic acid sols are applied to the uncrosslinked silicone coating and then dried. The best effect is achieved with alkali-stabilized silicic acid sols in which the particles are larger than about 20 nm, preferably about 20–130 nm.

To improve the wetting of the photosensitive coating, a small quantity of water-soluble wetting agent, in particular an anionic or nonionic wetting agent, is advantageously added to the sol. Alkali metal salts of long-chain alkanoic acids, alkylsulfonic acids, monoalkyl sulfates, alkylbenzenesulfonic acids and polyalkoxyphenol ethers are suitable. Since the wetting agent itself counteracts good adhesion, the quantity of wetting agent should be kept as low as possible. In general, quantities of about 1 to 15, preferably about 1 to 10 and, in particular, about 1 to 5 % by weight are used, based on the quantity of silicic acid. It is advantageous to use wetting agents which produce a particularly strong reduction in the surface tension of the silicic acid sols.

The surface tension of the silicic acid sols may also be reduced by mixing with water-soluble organic solvents. Wetting agents and solvents may also be added simultaneously to the silicic acid sols.

The concentration of the silicic acid sols is so chosen that the silicic acid/wetting agent coating has a weight after drying, of about 0.01–1.0 $g/m^2$, preferably 0.1–0.5 $g/m^2$. Normally, coating solutions are used which contain about 1% of solid silicic acid.

The silicic acid sols may contain water-soluble or water-dispersible binders which become insoluble on drying. Aqueous solutions and dispersions of acrylic resins have proved successful. The ratio of solid silicic acid to binder may be about 10:1 to 1:50, preferably about 1:1 to 1:10.

The silicic acid particles presumably anchor themselves to the silicone elastomer coating by a chemical reaction. It is assumed that a condensation reaction occurs between the hydroxyl groups situated at the surface of the silicic acid particles and the hydroxyl groups of the high molecular weight uncrosslinked polysiloxanes.

Adhesive coatings based on photosensitive halogen compounds are obtained by applying a solution of the substances in an organic solvent to the uncrosslinked silicone elastomer coating, drying the wet film and exposing to actinic light.

Photosensitive halogen compounds used are compounds containing halogenated methyl groups, in particular trihalomethyl groups. In this connection simple compounds such as iodoform may be involved. Preferably, however, use is made of non-volatile substances, for example substituted trichloromethyl triazines such as are described in DE Pat. No.-C-2,718,259 and EP Pat. No.-A-137,452. Other heterocyclics substituted with trichloromethyl groups are also suitable.

The photosensitive substances or substance mixtures are only firmly anchored to the silicone elastomer coating on exposure to UV light. The anchoring mechanism has not yet been elucidated. The exposure to light can be carried out with the same lamps as are used for the copying operation.

In order that the adhesive layer formed can be removed during the development operation along with the soluble parts of the photosensitive coating exposed to the image, it should not be thicker than about 1 μm.

To anchor the photosensitive coating on the silicone elastomer coating, both types of adhesive coatings may be used together. A double coating composed of a silicic acid coating situated underneath and an exposed coating of photosensitive halogen compounds situated on top, as a rule, produces a stronger adhesion than the silicic acid coating alone.

After applying the adhesive coating and before applying the photosensitive coating, it is advisable to partially vulcanize the silicone elastomer coating by heating briefly (for example, 10–60 s at 110° C.). In the absence of this step, the photosensitive coatings exhibit somewhat less adhesion. In the copying process, this leads to a somewhat reduced image quality. On the other hand, a complete vulcanization before the application of the photosensitive coating makes the complete removal of the adhesive coating at the non-image areas more difficult during the development operation.

To produce the photosensitive coating, the adhesion-promoted silicone coating is coated with known coating solutions. Both positive-working and also negative-working coatings can be applied. The solutions mostly contain, in addition to the photosensitive substance and a suitable solvent, film-forming binders, sensitizers, stabilizers, etc.

As photosensitive substances in negative copying coatings, use may be made of diazo compounds, for example p-diazodiphenylamine derivatives and p-quinone-diazides, organic azides, polyvinyl cinnamates, polyvinyl cinnamylidene compounds, homopolymers and copolymers of cinnamoyloxyethyl acrylate or methacrylate. In addition, photopolymerizable mixtures of monomers and photoinitiators may be used.

Examples of photosensitive materials for negative copying coatings are specified in U.S. Pat. Nos. 2,649,373, No. 2,714,066, No. 3,751,257, No. 2,754,209, No. 2,975,053, No. 2,994,608, No. 2,995,442 and No. 3,209,146.

As photosensitive substances for positive coatings, use is made, for example, of o-quinone diazides or salts of p-diazodiphenylamine with heteropolyacids. Examples of 1,2-quinone diazides are specified in U.S. Pat. Nos. 2,772,972, No. 2,767,092, No. 2,766,118, No. 2,859,112, No. 2,907,655, No. 3,046,110, No. 3,046,121, No. 3,061,430 and No. 3,106,465.

Preferred 1,2-quinone-diazides are esters of 1,2-naphthoquinone-2-diazide-4-sulfonic acid or 1,2-naphthoquinone-2-diazide-5-sulfonic acid with polymeric phenols which are obtained by reaction of polyhydric phenols with ketones. The polymeric phenol is preferably composed of a product obtained by reacting acetone with pyrogallol at room temperature in the presence of a catalyst such as phosphorus oxychloride. The equivalent ratio of sulfonic acid to polymeric phenol may be in the range from about 1:0.6 to 1:2, preferably from about 1:1 to 1:1.8.

So that the coating solutions wet the adhesion-promoted, incipiently crosslinked silicone elastomer coating well, about 0.01% to 2%, preferably about 0.1% to 1% of a polysiloxane or wetting agent is added to them. Suitable polysiloxanes are commercial silicone oils, silicone levelling agents and polysiloxanones, such as are used to produce silicone rubber. Preferred wetting agents are, for example, the fluorinated surfactants.

To improve the coating adhesion, the coating solution may contain additional binders, for example, vinyl chloride/vinyl acetate copolymers which are soluble in organic solvents.

After applying the photosensitive coating, the material is heated for a few minutes to about 100°-120° C. until the silicone rubber coating is sufficiently crosslinked.

Metals are usually used as substrates. For offset printing plates, use may be made of bright-rolled, mechanically or electrochemically roughened and optionally anodized aluminum which may be pretreated with polyvinylphosphonic acid, silicates, phosphates, hexafluorozirconates or with hydrolyzed tetraethyl orthosilicate. Further suitable metals are steel and chromium. Since, in contrast to normal lithographic printing plates, the base surface does not take part in the printing operation, in principle any substances may serve as base surface. The base surface may also carry an adhesion-promoting coating. In the case of strongly reflecting base surfaces, an anti-halation coating (anti-halo coating) may also be provided. Furthermore, use may be made of plastic films, such as polyester, polycarbonate, polyimide, polyethersulfone, polytetrafluoroethylene or cellulose acetate films, the surface of which may optionally be roughened or otherwise pretreated to increase the adhesion of the silicone elastomer coating. Furthermore, known printing plate substrates composed of paper, which in this case do not have to be moisture resistant, are suitable. Gum elastic base materials are also suitable.

A print-ready lithographic printing form is obtained from the presensitized material by exposure beneath a film-type original and by development. For exposure, for example, mercury vapor high-pressure lamps, carbon-arc lamps, metal-halide lamps, pulsed xenon lamps, fluorescent tube equipment, laser equipment, electron-beam tubes and other known exposure equipment are suitable.

In the development operation, the more readily soluble parts of the radiation-sensitive coating and the regions of the interlayer situated thereunder are dissolved or removed. In this process, the surface of the silicone rubber coating is uncovered. Suitable developers are commercial solutions matched to the sensitive coatings, in particular aqueous solutions. During development, the intermediate coating has to be removed completely at the image-free areas. Residues of the coating result in scumming during printing. Strongly basic developers are particularly good for removing the silicic acid adhesive coating. The surface which is uncovered repels printing ink, while the regions of the photosensitive coating which have remained intact accept the ink. The developed plate may be inked in or outside the printing press.

In the case of plates with positive copying coatings composed of o-quinone-diazide and novolaks, the run can be considerably increased by heating the finished printing form for several minutes at temperatures of 200°-240° C. During heating, the adhesion of the image to the adhesive silicone coating decreases considerably. At the same time, the image becomes more abrasion-resistant. To remove residues of the silicic acid adhesive coating more reliably, post-heated plates may therefore be treated yet again intensively with dilute hydroxides or basic developers without the image being damaged in the process.

The invention is explained in detail on the basis of the examples below. Parts by weight (pbw) and parts by volume (pbv) are in the ratio of g to ml. Quantity ratios and percentages are, unless otherwise noted, to be understood in units by weight.

EXAMPLE 1

An electrolytically roughened and anodized aluminum plate was coated with the aid of a plate spin-coater (160 rpm) with the following silicone elastomer solution:

| 84 | pbw | of an aliphatic hydrocarbon mixture, boiling range 116°-142° C., |
|---|---|---|
| 15 | pbw | of a 33% solution of a dihydroxypoly-dimethylsiloxane in toluene, viscosity at 25° C. of 9,000 to 15,000 mPa.s, |
| 0.5 | pbw | of vinyltriacetoxysilane, |
| 0.5 | pbw | of dibutyl tin diacetate, |
| 0.5 | pbw | of 3-glycidyloxypropyltrimethoxysilane. |

The coating was dried and coated in the essentially uncrosslinked state with the following adhesive coating solution and dried:

| 74.5 | pbv | of demineralized water, |
|---|---|---|
| 20 | pbv | of isopropanol, |
| 4 | pbv | of 30% anionic silicic acid sol having an $Na_2O$ content of approx. 0.15% and a particle size of 25-30 nm. and |
| 1.5 | pbv | of a 1% solution of nonylphenol |

-continued

| | | |
|---|---|---|
| | | polyglycol ether in demineralized water. |

After the adhesive coating had been dried with hot air, the silicone elastomer coating was incompletely vulcanized by heating for 1 minute at 110° C.

A filtered solution of:

| 1.8 | pbw | of the naphthoquinone-diazide-sulfonic acid ester described below, |
|---|---|---|
| 0.22 | pbw | of 1,2-naphthoquinone-2-diazide-4-sulfonyl chloride, |
| 0.07 | pbw | of 2,3,4-trihydroxybenzopheone, |
| 6.6 | pbw | of a cresol/formaldehyde novolak having a melting range of 105°–120° C. according to DIN 53 181, |
| 0.08 | pbw | of crystal violet, and |
| 0.4 | pbw | of a fluorinated surfactant (esterification product of a polyglycol with oxyethylene and oxypropylene units and a perfluoroalkanoic acid) in |
| 91.22 | pbw | of a mixture of 5 pbv of tetrahydrofuran, 4 pbw of ethylene glycol monomethyl ether, 1 pbv of butyl acetate, and |
| 75.0 | pbw | of isopropanol | was then spin-coated and dried.

The naphthoquinone-diazide-sulfonic acid ester used in the above formulation was prepared as follows:

A solution of 25.5 pbw of 1,2-naphthoquinone-2-diazide-5-sulfonyl chloride in 442 pbw of acetone was clarified over active charcoal. 26.3 pbw of the above-specified cresol/formaldehyde novolak and 4.4 pbw of 2,3,4-trihydroxybenzophenone were dissolved in the solution and the whole was mixed with a solution of 11.9 pbw of NaHCO₃ in 124 pbw of water and with 160 pbw of saturated sodium chloride solution. The mixture was stirred for 10 minutes, allowed to stand, the lower phase was discarded and the acetone solution was allowed to flow into a solution composed of 6 pbw of HCl (30%) and 1,500 pbw of water in the course of a few minutes. The yellow flaky reaction product precipitated was filtered off by suction, washed out with water and dried. The yield was 48 pbw.

After the photosensitive coating had been dried, the silicone coating was vulcanized completely by heating at 110° C. for 3 minutes.

The presensitized printing plate so obtained was exposed beneath a positive film original (60 l/cm screen) for 25 s with a 5 kW metal halide lamp at a distance of 120 cm and then carefully developed. In this process, the photosensitive coating and the silicic acid coating were stripped off at the exposed areas. The developer used was composed of an aqueous solution of 10% by weight of sodium metasilicate nonahydrate.

After the developer liquid had been rinsed off with water, the plate was heated at 230° C. for 5 minutes and then wiped with a wad moistened with hydroxide. The hydroxide used was a solution of 0.4 pbw of NaOH in 50 pbv of water and 50 pbv of isopropanol.

The plate so obtained yielded 10,000 good impressions on an offset printing press, from which the dampening unit had been removed, before the finest screen points stripped. A plate produced under the same conditions but not post-heated exhibited decreasing image quality in the printing operation even after a few 100 impressions. If the plate was produced without the adhesive coating, the image was damaged even during development as a consequence of unsatisfactory adhesion.

EXAMPLE 2

Example 1 was repeated, but the following mixture of RTV-1 and RTV-2 silicone elastomer was used to prepare the silicone rubber coating:

| 84 | pbw | of the hydrocarbon mixture as in Example 1, |
|---|---|---|
| 7.5 | pbw | of the dihydroxypolydimethylsiloxane solution mentioned in Example 1, |
| 0.25 | pbw | of vinyltriacetoxysilane, |
| 0.25 | pbw | of 3-glycidyloxypropyltrimethoxysilane, |
| 0.15 | pbw | of dibutyl tin diacetate, |
| 7.5 | pbw | of a 40% toluenic solution of a filler-containing single-component silicone elastomer of the acetic acid type with a viscosity of approx. 250 mPa.s (23° C.). |

It was possible to produce over 10,000 impressions with the finished printing form on the offset printing press (without water) before the image quality decreased.

EXAMPLE 3

Example 2 was repeated, the following mixture being used instead of the 7.5 pbw of the solution containing the single-component silicone elastomer:

| 6.25 | pbw | of an 80% toluene solution of a filler-containing single-component silicone elastomer of the acetic acid type having a viscosity of approx. 65.000 at 23° C., |
|---|---|---|
| 3.75 | pbw | of the hydrocarbon mixture as in Example 1. |

Over 5,000 impressions were produced with the plate on the offset printing press.

EXAMPLE 4

To produce an adhesive base, the following solution was spin-coated (160 rpm) onto an uncrosslinked silicone elastomer coating produced as in Example 1:

| 0.3 | pbw | of 2-(4-styrylphenyl)-4,6-bistri-chloromethyl-s-triazine, |
|---|---|---|
| 0.2 | pbw | of fluorinated surfactant as in Example 1, |
| 100 | pbv | of toluene. |

The material was subsequently heated at 110° C. for 1 minute and then exposed in tube exposure equipment (120 W) for 3 minutes without original. The application of the photosensitive coating, the complete vulcanization of the silicone rubber coating and the processing to produce a ready-to-use printing form was carried out in accordance with the directions of Example 1. The post-treatment with aqueous alcoholic sodium hydroxide solution was eliminated.

The plate yielded 40,000 good impressions using a dry offset printing ink on an offset printing press.

EXAMPLE 5

Example 4 was repeated, but instead of the trichloromethyltriazine mentioned there, 2-(4-ethoxynaphth-1-yl)-4,6-bistrichloromethyl-s-triazine was used.

It was possible to produce more than 11,000 good impressions with the printing form produced on a small offset printing press (without dampening unit).

EXAMPLE 6

An electrolytically roughened and anodized aluminum plate was coated successively with a silicone elastomer coating and a silicic acid adhesive coating according to the directions in Example 1. The following solution was then spin-coated:

| 0.25 | pbw | of the trichloromethyltriazine specified in Example 4, |
| 0.2 | pbw | of fluorinated surfactant as in Example 1, |
| 100 | pbv | of toluene. |

The material was heated at 110° C. for 1 minute and was exposed for 3 minutes without original in tube exposure equipment (120 W), then provided with a photosensitive coating according to the directions in Example 1 and completely vulcanized.

The conversion of the presensitized printing plate into a finished printing form was also carried out according to the directions of Example 1.

The plate yielded 8,000 good impressions on a small offset printing machine without dampening unit.

It was possible to increase the print run still further by adding 0.5% of a commercial copolymer of vinyl chloride, vinyl acetate and 1% of maleic acid to the coating solution.

EXAMPLE 7

In the silicone elastomer solution described in Example 1, the hydrocarbon mixture used was replaced by toluene which had been saturated previously with nonpolar polyethylene wax (dropping point 118°–123° C.). The solution was spin-coated on an electrolytically roughened and anodized aluminum foil. The dried coating was coated with the following solution:

| 0.3 | pbw | of the triazine specified in Example 4, |
| 0.2 | pbw | of fluorinated surfactant as in Example 1, |
| 100 | pbv | of toluene. |

After being heated at 110.C for 1 minute and exposed in a tube exposure equipment (120 W) for 3 minutes, the material was provided with a photosensitive coating according to the directions in Example 1 and further processed to yield a ready-to-use printing form. Without post-heating, the printing form yielded 2,000 good impressions in a small offset printing press (without dampening unit).

EXAMPLE 8

An anodized aluminum foil was provided with a silicone elastomer coating as in Example 1 and with an adhesive coating as in Example 4. The following solution was then spin-coated and dried:

| 1.2 | pbw | of the esterification product of 1 mol of 2,3,4-trihydroxybenzophenone and 2 mol of 1,2-naphthoquinone-2-diazide-5-sulfonyl chloride, |
| 0.7 | pbw | of the esterification product of 1 mol of 2,2'-dihydroxydinaphth-1,1'-yl-methane and 2 mol of 1,2-naphthoquinone-2-diazide-5-sulfonyl chloride, |
| 6.5 | pbw | of the novolak specified in Example 1, and |
| 0.05 | pbw | of Sudan Yellow GGN (C.I. 11 021) | in a solvent mixture composed of

| 40 | pbw | of 2-methoxyethanol, |
| 50 | pbw | of tetrahydrofuran, and |
| 8 | pbw | of butyl acetate. |

The material was heated at 110° C. for 3 minutes and then exposed for 2.5 minutes in 120 W tube exposure equipment under a positive film original (60 l/cm screen) and then developed with the developer specified in Example 1.

1,500 good impressions were obtained with the finished printing form on a small offset press. If the printing form was heated at 230° C. for 5 minutes before being used, it yielded approx. 5,000 impressions. It was not possible to develop a comparison plate without adhesive coating without producing faults.

EXAMPLE 9

An electrolytically roughened aluminum foil was coated with the following silicone elastomer solution on a plate spin-coater (160 rpm):

| 84 | pbw | of the hydrocarbon mixture as in Example 1, |
| 15 | pbw | of the dihydroxypolydimethylsiloxane solution mentioned in Example 1, |
| 1 | pbw | of vinyltriacetoxysilane, and |
| 0.3 | pbw | of dibutyl tin diacetate. |

After drying with hot air, the following adhesive coating solution was spin-coated:

| 57 | pbv | of demineralized water, |
| 38 | pbv | of isopropanol, |
| 3 | pbv | of a 40% zinc-salt-containing aqueous solution of an acrylic acid copolymer having a pH of approx. 7.5–8.0 (Primal B-505) |
| 2 | pbv | of the silicic acid sol mentioned in Example 1. |

Subsequently the silicone coating was crosslinked by heating at 110° C. for 4 minutes and then the following copying solution was spin-coated:

| 1.59 | pbw | of the polycondensation product of 1 mol of 3-methoxydiphenylamine-4-diazonium salt and 1 mol of 4,4'-bismethoxy-methyldiphenyl ether, precipitated as the mesitylenesulfonate, |
| 0.17 | pbw | of phosphoric acid (85%), |
| 0.31 | pbw | of Victoria Pure Blue FGA (C.I. 42 595), |
| 0.2 | pbw | of the fluorinated surfactant specified in Example 1, |
| 70 | pbv | of butanone, |
| 30 | pbv | of 2-methoxyethanol. |

After being dried for 1 minute at 110° C., the material was exposed beneath a negative film original (60 l/cm screen) according to the directions in Example 1 and then developed with a solution of:

| 5 | pbw | of sodium undecanoate, |
|---|---|---|
| 3 | pbw | of a block copolymer composed of 80% propylene oxide and 20% ethylene oxide, and |
| 3 | pbw | of tetrasodium diphosphate in |
| 89 | pbw | of demineralized water. |

The plate was heated at 230° C. for 5 minutes and finally wiped with a 1% aqueous alkali metal hydroxide solution.

2,000 impressions were obtained with the plate in an offset printing press without dampening unit before the finest screen points began to strip. If the post-heating was dispensed with, the print run was similarly high, but the plate exhibited a distinct tendency to scum. On attempting to produce the plate without adhesive layer, it was not possible to develop images without faults.

EXAMPLE 10

An electrolytically roughened aluminum foil was coated with an uncrosslinked silicone rubber coating as in Example 9 and then coated with the following adhesive solution:

| 76.1 | pbv | of demineralized water, |
|---|---|---|
| 20 | pbv | of isopropanol, |
| 2.4 | pbv | of 50% aqueous silicic acid sol having a Na$_2$O content of 0.2% and a mean particle size of 125 nm, |
| 1.5 | pbv | of a 1% solution of nonylphenol polyglycol ether in demineralized water. |

The following solution was spin-coated on the dried coating and dried:

| 62 | pbw | of a reaction product of 50 pbw of a polyvinyl butyral containing 71% vinyl butyral units, 2% vinyl acetate units and 27% vinyl alcohol units and 4 pbw of maleic anhydride, |
|---|---|---|
| 21 | pbw | of the diazonium salt polycondensation product specified in Example 9, |
| 2.5 | pbw | of phosphoric acid (85%), |
| 3 | pbw | of Victoria Pure Blue FGA, |
| 0.7 | pbw | of phenylazodiphenylamine, and |
| 17 | pbw | of a 50% solution of a lacquer-compatible siloxane copolymer in xylene/isobutanol 4:1, in |
| 2570 | pbw | of 2-methoxyethanol, and |
| 780 | pbw | of tetrahydrofuran. |

After the silicone coating had been vulcanized by heating at 110° C. for 4 minutes, the material was exposed for 1 minute in a 120 W tube exposure equipment beneath a negative film original (60 l/cm screen) and the unexposed areas were then stripped with the following developer:

| 3 | pbw | of 2-phenoxyethanol, |
|---|---|---|
| 2 | pbw | of Graham's salt, |
| 2 | pbw | of polyvinylmethylacetamide, |
| 4 | pbw | of pelargonic acid, |
| 1 | pbw | of KOH, |
| 3 | pbw | of triethanolamine, |
| 77 | pbw | of demineralized water. |

The printing forms produced exhibited decreasing image quality in a small offset printing press without dampening unit only after 2,000 impressions. If the printing form was heated for 5 minutes at 150° C. before being used, the print run increased to approx. 7,000.

It was not possible to develop a comparison plate without adhesive coating without damaging the screen image. If a line original was used, although it was possible to develop the image, the image wore off in the printing operation after a few 100 impressions.

What is claimed is:

1. A presensitized printing plate for waterless lithographic printing comprising:
    a substrate;
    a printing ink-repellent crosslinked silicone elastomer coating situated on said substrate;
    an intermediate coating overlying said silicone elastomer; and
    a radiation-sensitive coating overlying said intermediate coating,
    wherein the intermediate coating comprises one each of an intermediate coating of amorphous silicic acid and of an exposed photosensitive organic halogen compound.

2. A presensitized printing plate for waterless lithographic printing comprising:
    a substrate;
    a printing ink-repellent crosslinked silicone elastomer coating situated on said substrate;
    an intermediate coating of an exposed photosensitive organic halogen compound overlying said silicone elastomer; and
    a radiation-sensitive coating overlying said intermediate coating.

3. The printing plate as claimed in claim 2, wherein the organic halogen compound contains a trihalomethyl group.

4. The printing plate as claimed in claim 2, wherein the organic halogen compound comprises a heterocyclic compound containing at least one trichloromethyl substituent.

5. The printing plate as claimed in claim 1, wherein the intermediate coating has a weight per unit area of about 0.01 to 1 g/m$^2$.

6. The printing plate as claimed in claim 2, wherein the silicone elastomer is a two-component elastomer that can be crosslinked at room temperature.

7. The printing plate as claimed in claim 2, wherein the silicone elastomer coating has a weight per unit area of about 1 to 50 g/m$^2$.

8. The printing plate as claimed in claim 2, wherein the radiation-sensitive coating contains at least one of a polysiloxane and a wetting agent.

9. A process for producing a presensitized printing plate for waterless lithographic printing, comprising the steps of:
    applying a silicone elastomer coating to a substrate and drying it;
    applying an intermediate coating comprising a photosensitive organic halogen compound to the uncrosslinked silicone elastomer coating;
    exposing the intermediate coating to actinic light without original;
    applying a radiation-sensitive coating; and
    crosslinking the silicone elastomer coating to form silicone rubber.

10. The process as claimed in claim 9, wherein the silicone elastomer coating is incompletely crosslinked after applying the intermediate coating and before applying the radiation-sensitive coating.

11. A process for producing a presensitized printing plate for waterless lithographic printing, comprising the steps of:
- applying a silicone elastomer coating to a substrate and drying it;
- applying a first intermediate coating of amorphous silicic acid;
- applying a second intermediate coating comprising a photosensitive organic halogen compound to the first intermediate coating;
- exposing the intermediate coatings to actinic light without original;
- applying a radiation-sensitive coating; and
- crosslinking the silicone elastomer coating to form silicone rubber.

* * * * *